United States Patent

Wang

[11] Patent Number: 5,811,853
[45] Date of Patent: Sep. 22, 1998

[54] SINGLE-SIDE OXIDE SEALED SALICIDE FOR EPROMS

[75] Inventor: Jung-Chun Wang, Hsin-Chu, Taiwan

[73] Assignee: Winbond Electronics Corp., Hsinchu, China

[21] Appl. No.: 700,571

[22] Filed: Aug. 13, 1996

Related U.S. Application Data

[62] Division of Ser. No. 575,748, Dec. 20, 1995, Pat. No. 5,597,751.

[51] Int. Cl.$^6$ .......................... H01L 29/788; H01L 29/76
[52] U.S. Cl. .......................... 257/316; 257/315; 257/320; 257/384; 257/385; 438/264; 438/267
[58] Field of Search ...................... 257/315, 316, 257/320, 384, 385; 437/43, 49; 438/264, 267

[56] References Cited

U.S. PATENT DOCUMENTS

| | | | |
|---|---|---|---|
| 4,853,895 | 8/1989 | Mitchell et al. | 257/320 |
| 4,996,572 | 2/1991 | Tanaka et al. | 257/320 |
| 5,036,378 | 7/1991 | Lu et al. | 257/320 |
| 5,041,886 | 8/1991 | Lee | 257/320 |
| 5,051,796 | 9/1991 | Gill | 257/316 |
| 5,494,838 | 2/1996 | Chang et al. | 437/43 |
| 5,576,569 | 11/1996 | Yang et al. | 257/321 |

FOREIGN PATENT DOCUMENTS

| | | | |
|---|---|---|---|
| 61-30063 | 2/1986 | Japan | 257/316 |
| 5-129612 | 5/1993 | Japan | 257/316 |

*Primary Examiner*—Valencia Martin Wallace

[57] ABSTRACT

A method of forming a memory cell structure in a semiconductor substrate that does not have a shorting problem between a floating gate and a source/drain region of the substrate by depositing a thick spacer oxide layer on top of the floating gate and the source/drain region to a sufficient thickness such that electrical insulation is provided therein-between to prevent the occurrence of a short or the formation of a silicide bridge. The invention is also directed to a semiconductor device fabricated by the method.

7 Claims, 2 Drawing Sheets

SINGLE-SIDE OXIDE SEALED SALICIDE FOR EPROMS

This is a divisional of application Ser. No. 08/575,748, filed on Dec. 20, 1995 U.S. Pat. No. 5,597,751.

FIELD OF THE INVENTION

The present invention generally relates to a single-side oxide sealed salicide process for the fabrication of erasable programmable read only memory (EPROM) or Flash Memory and more particularly, to a single-side oxide sealed salicide process for the fabrication of EPROM or Flash Memory that does not have the silicide bridge problem.

BACKGROUND

In the recent advance in semiconductor technology, specifically in the very large scale integration (VLSI) technology, a prominent objective is to increase the density, and thus the number of memory cells on a semiconductor chip to reduce costs and to increase operating speed. In particular, there has been much development into non-volatile memory devices, i.e., a type of memory device that retains stored data even after power to the device has been turned off. One of such devices is an electrically programmable ROM (EPROM).

An EPROM implements non-volatile storage of data by using a storage transistor having a so-called floating gate. The floating gate is located between a control gate and substrate and unlike the control gate, the floating gate is not connected to a word, bit, or any other line; and therefore it "floats". The EPROM is programmed by injecting hot electrons into the floating gate to cause a substantial shift in the threshold voltage of the storage transistor. Under high gate and high drain voltages, electrons gain sufficient energy to jump the silicon-silicon dioxide energy barrier, penetrating the oxide and flowing to the floating gate, which is completely surrounded by an oxide layer. The injected electrons cause a 5 to 10 volt increase in the threshold of the device, changing it from an ON to an OFF state when a nominal 5 volt read voltage is applied to the control gate. That is, if the floating gate holds electrons, it is negatively charged.

In a process of fabricating an EPROM or a Flash Memory device, a conventional salicide (self-aligned silicide) process cannot be used. A salicide process is a process in which a sandwich of silicide on polysilicon approach is extended to include the formation of source and drain regions using the silicide. The effect of a salicide process is to reduce the additional layer interconnect resistance, allowing the gate material to be used as a moderate long-distance interconnect. The reason that a conventional salicide process cannot be used in the fabrication of EPROM or Flash Memory cells is that because of the small thickness of the sidewall dielectric spacer that is build on the floating gate, a short circuit frequently occurs between the floating gate and the source/drain regions. The short circuit or the formation of a silicide bridge destroys the functions of the memory cell.

The deficiency of a conventional salicide process when used in an EPROM or Flash Memory cell is illustrated in FIG. 1. A split-gate EPROM cell 10 is shown in FIG. 1 having a control gate 12, a floating gate 14, a sidewall spacer 16 of a dielectric material, a VSS source region 18, a drain region 20 in a semiconductor substrate 22. In a conventional EPROM or flash fabrication process, a VSS source region 18 is first formed in a semiconductor substrate 22. A thin layer of oxide 24 is then formed on the surface of the substrate 22 by either a thermal oxidation process or a deposition process. The layer of thin oxide 24 is also known as a tunneling oxide layer since it allows tunneling electrons to pass from the substrate 22 to the floating gate 14. A floating gate 14 of a conductive material such as polycrystalline silicon is then formed on the tunneling oxide layer 24. The pattern for the floating gate 14 is defined by a thick oxide layer which is formed like a LOCOS oxide 26.

After the floating gate 14 is covered by a layer of oxide material or "ONO spacer", i.e. oxide/nitride/oxide (ONO) material, a control gate 12 of a second conductive material is formed on top of the floating gate 14 and the dielectric "ONO spacer". In the next step of etching the sidewall spacer 16, a portion 28 of the floating gate 14 can be exposed, i.e. the conductive polycrystalline silicon exposed from under the dielectric material 26. Prior to the formation of a salicide process, a hydrofluoric acid (or B.O.E.) dip may be required in order to remove residual oxide in the silicide area. The portion 28 of floating gate 14 is therefore exposed more and more. This process leads to the formation of a silicide bridge (or a short circuit) between the floating gate 14 at portion 28 and the thin oxide area 32 on the VSS source junction 18.

It is therefore an object of the present invention to provide a single-side oxide sealed salicide process for the fabrication of EPROM or Flash Memory cells without the drawbacks and shortcomings of the prior art methods.

It is another object of the present invention to provide a single-side oxide sealed salicide process for the fabrication of EPROM or Flash Memory cells that does not have short circuit problems between the floating gate and the source/drain regions.

It is a further object of the present invention to provide a single-side oxide sealed salicide process for the fabrication of EPROM or Flash Memory cells that does not have silicide bridge formation by the addition of a photoresist layer prior to the etching of the sidewall spacer such that the oxide layer on top of the floating gate remains unetched.

It is still another object of the present invention to provide a semiconductor structure for an EPROM or Flash Memory cell that does not have silicide bridge problems.

It is yet another object of the present invention to provide an EPROM or Flash Memory cell that does not have short circuit problems by depositing an electrically insulating CVD oxide layer on top of the floating gate.

SUMMARY OF THE INVENTION

In accordance with the present invention, a single-side oxide sealed salicide process for the fabrication of and EPROM or Flash Memory cell is provided.

In the preferred embodiment, the process including the steps of forming a source region in a semiconductor substrate having a conductivity opposite to that of the substrate, forming a layer of a first dielectric material such as silicon dioxide on the semiconductor substrate including a tunnel dielectric region, forming a floating gate from a first conductive material such as polycrystalline silicon on the layer of the first dielectric material extending over the tunnel dielectric region, forming a layer of a second dielectric material such as oxide/nitride/oxide sidewall spacer on the edge of floating gate, forming a control gate from a second conductive material such as polycrystalline silicon on the second dielectric material, depositing a layer of a third dielectric material such as a CVD oxide on the control gate, coating a layer of a photoresist on the third dielectric material overlaying the source region and at least a portion of the control gate and the floating gate, etching away the layer of the third dielectric material except the area under the photoresist and the area of the sidewall spacers on the edges of the control gate, forming a drain region in the semiconductor substrate having the second conductivity type, and forming a metal silicide layer over the control gate that is not covered by the layer of the third dielectric material and also over the drain region.

The present invention is further directed to a semiconductor device structure that is suitable for use in an electrically-erasable programmable read only memory or a Flash memory cell including the components of a semiconductor substrate having a first conductivity type, a source region that has a second conductivity type opposite the first conductivity type, at least one drain region having the second conductivity type formed in the substrate, a layer of a first dielectric material formed over the substrate including a tunnel dielectric region, at least one floating gate of a first conductive material disposed on the layer of the first dielectric material overlaying the tunnel dielectric region, a layer of a second dielectric material disposed on the at least one floating gate, at least one control gate of a second conductive material such as polycrystalline silicon formed on the layer of the second dielectric material, and a layer of a third dielectric material such as a CVD oxide disposed on a portion of the second dielectric material, on a portion of the control gate, on the source region, and on the edge of the at least one control gate as sidewall spacers, a metal silicide layer disposed on areas not covered by the layer of the third dielectric material including at least a portion of the at least one control gate, the at least one drain regions, the layer of the third dielectric material has a thickness that is sufficient to electrically insulate the at least one floating gate and the at least one control gate so as to prevent the occurrence of a silicide bridge between the at least one floating gate and the source region, and between the at least one control gate and the drain region.

BRIEF DESCRIPTION OF THE DRAWINGS

Other objects, features and advantages of the present invention will be come apparent upon consideration of the specification and the appended drawings, in which.

DETAILED DESCRIPTION OF THE PREFERRED EMBODIMENT

The present invention provides a method of forming a single-side oxide sealed salicide for an EPROM or Flash memory cell that does not have the occurrence of silicide bridge problems. The process entails an additional photoresist step during which a CVD oxide layer deposited on top of the floating gate is protected from being etched away in an anisotropic etching process. The thick CVD oxide layer provides sufficient electrical insulation of the floating gate and prevents the formation of a silicide bridge with the source region.

Figure 1:
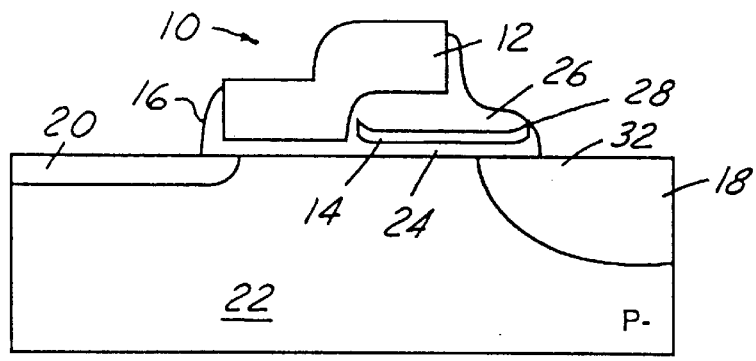
FIG. 1 is an enlarged cross-sectional view of a prior art EPROM memory cell.
Figure 2:
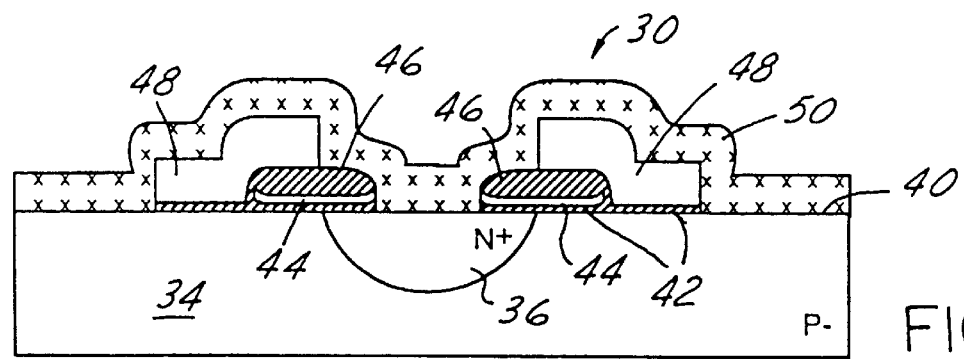
FIG. 2 is an enlarged cross-sectional view of a present invention EPROM memory cell with a CVD oxide deposited on top.
Figure 3:
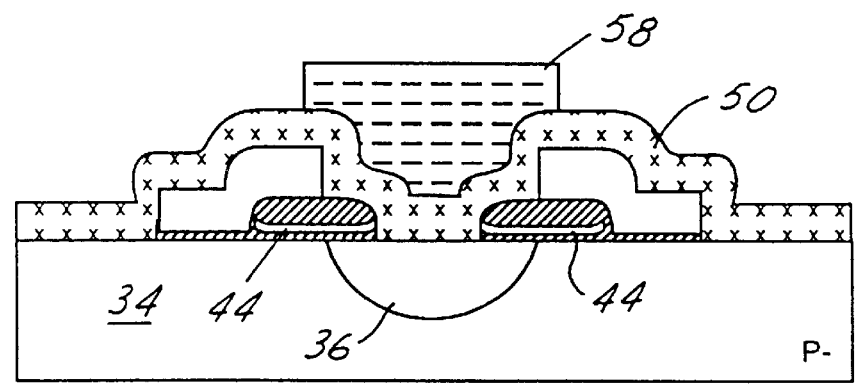
FIG. 3 is an enlarged cross-sectional view of the present invention EPROM memory cell with a photoresist layer deposited on top.

Referring initially to FIG. 2, wherein an enlarged cross-sectional view of the present invention EPROM or Flash memory cell 30 is shown. A tunneling oxide layer 42 is first formed on a top surface 40 of the semiconductor substrate 34 by a thermal oxidation process. A doped polycrystalline is formed on top of the tunneling oxide 42. The floating gate 44 is defined by a thick oxide mask 46 which is formed in a process similar to LOCOS. An oxide/nitride/oxide spacer 41 or "ONO spacer" is then formed on the side of the floating gate 44 and channel ion implantation is carried out. Control gates 48 are then formed of a conductive material such as polycrystalline silicon. This is followed by a VSS junction formation and the implantation of lightly doped drain (LDD) regions. A spacer oxide layer 50 is finally deposited by a chemical vapor deposition technique to a thickness of between 150–300 nm. The above processes are well known in the art and therefore, detailed fabrication steps are not described.

The present invention utilized a self-aligned technique for the formation of salicide layers. The technique has been a preferred method for forming integrated circuits and devices due to their simplicity and their ability to form high density components. The present invention novel method forms an EPROM or flash memory cell that has low junction leakage and a low occurrence of shorting between the gates and the source/drain regions.

The invention further utilizes a combination of silicide and polycrystalline silicon (commonly known as polycide) instead of a conventional polycrystalline silicon for gate interconnects in VLSI devices to reduce sheet resistance.

Figure 4:
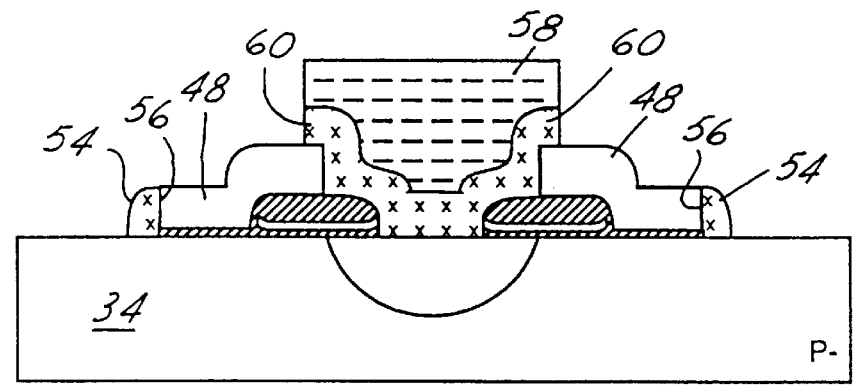
FIG. 4 is an enlarged cross-sectional view of the present invention EPROM memory cell with the unprotected oxide layer etched away.
Figure 5:
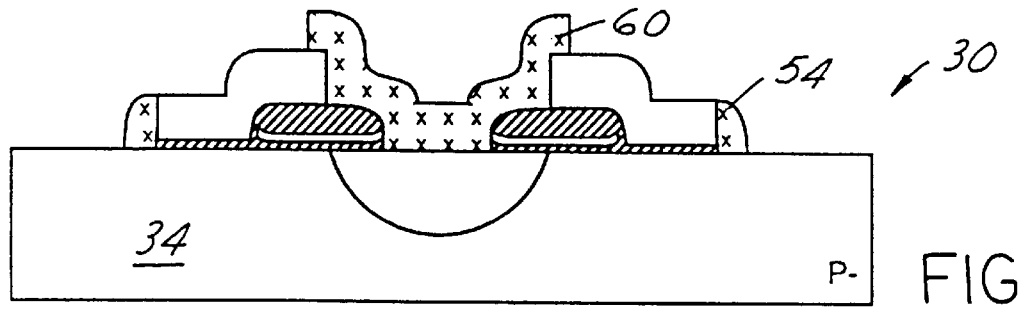
FIG. 5 is an enlarged cross-sectional view of the present invention EPROM memory cell with the photoresist layer removed.
Figure 6:
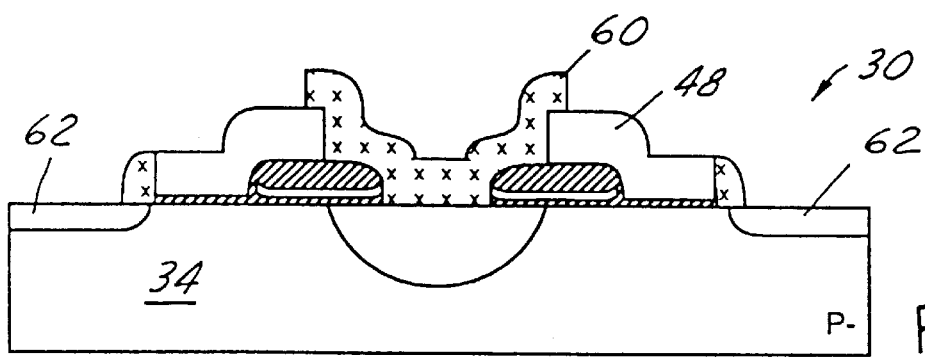
FIG. 6 is an enlarged cross-sectional view of the present invention EPROM memory cell with the drain regions formed.
Figure 7:
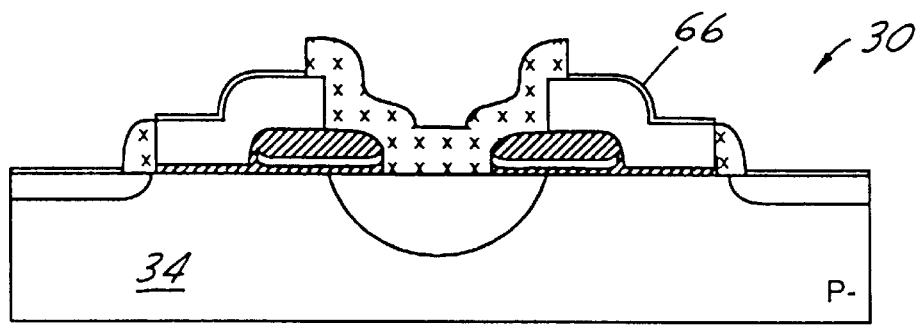
FIG. 7 is an enlarged cross-sectional view of the present invention EPROM memory cell with a layer of salicide formed.

Instead of etching anisotropically the thick oxide layer 50 shown in FIG. 2, the present invention utilizes a novel method of depositing a photoresist layer 58 on top of a portion of the oxide layer 50, i.e. substantially covers the area of the floating gate 44 and the source region 36. A reactive ion etching (RIE) method with freon plasma is then used to anisotropically etch the oxide layer 50. This is shown in FIG. 4. The only portions of the oxide layer 50 left unetched are the sidewall spacers 54 formed on the edges 56 of control gate 48 and the oxide layer 60 covered by the photoresist 58. The width of the sidewall spacer 54 is in the range between 100–210 nm and provides sufficient electrical insulation to prevent shorting of the control gate 48.

In the next fabrication step, photoresist 54 is removed by known processing methods to expose the spacer oxide layer 60. An N+ drain region 62 is then formed by an implantation process. A titanian salicide deposition process is conducted which includes the steps of a pre-Ti deposition dip with hydrofluoric acid or B.O.E. to remove native oxide, and then titanian deposition, followed by a rapid thermal annealing process at approximately 650° C., followed by the removal of unreacted titanian, and then a second rapid thermal annealing process. The titanian silicide is formed by first sputtering or evaporating titanian metal on the surface of the device 30, and then forming titanian silicide at areas not covered by the spacer oxide 60.

Figure 8:
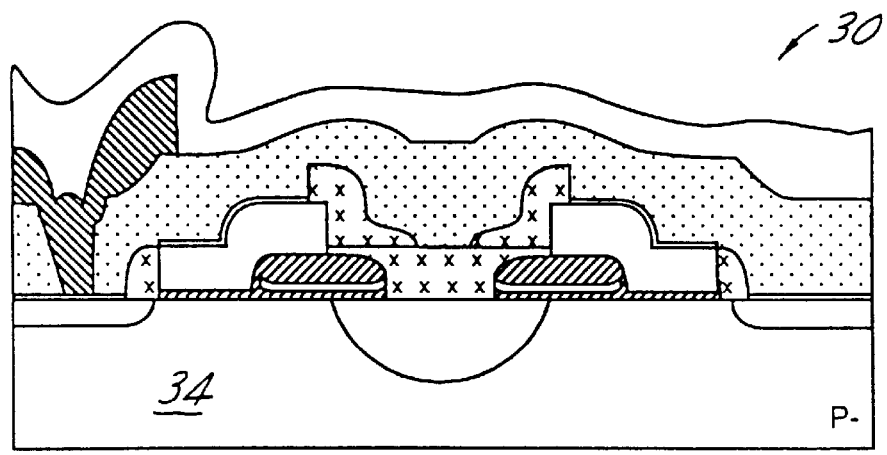
FIG. 8 is an enlarged cross-sectional view of the present invention EPROM memory cell after metalization and passivation.

FIG. 8 shows an enlarged cross-sectional view of the memory cell 30 after subsequent processing steps such as a BPSG (boron-phosphorus-silicate-glass) deposition, a BPSG flow process, a BPSG planarization process by chemical mechanical polishing or SOG (spin on glass) etch back, a contact open process, a metal deposition process, and a passivation process are completed.

The present invention novel method of depositing a thick spacer oxide layer on top of the floating gate can be used to effectively prevent shorting or the formation of a silicide bridge between the floating gate and the source/drain regions in the semiconductor substrate.

While the present Invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, the present invention unique process can be used in other type of memory devices other than EPROM and Flash.

The embodiments of the invention in which an exclusive property or privilege is claimed are defined as follows:

1. A semiconductor structure of the type suitable for use in an electrically-erasable read only memory or a Flash memory cell, comprising:

a semiconductor substrate of a first conductivity type, a source region having a second conductivity type opposite said first conductivity type in said substrate, at least one drain region having said second conductivity type formed in said substrate adjacent to a surface of said substrate, a layer of a first dielectric material formed over said substrate including a tunned dielectric region, at least one floating gate of a first conductive material disposed on said layer of first dielectric material overlaying substantially said tunnel dielectric region, a layer of a second dielectric material disposed on said at least one floating gate, at least one control gate of a second conductive material formed on said layer of second dielectric material;

a layer of a third dielectric material disposed on a portion of said second dielectric material, on a portion of said control gate, on said source region, and on one edge of said at least one control gate as a sidewall spacer, and a metal silicide layer hi substantially the same thickness disposed side-by-side with said layer of the third dielectric material on areas not covered by said layer of the third dielectric material including at least a portion of said at least one control gate and said at least one drain regions, said layer of the third dielectric material having a thickness sufficient to electrically insulate said at least one floating gate and said at least one control gate so as to prevent the occurrence of a silicide bridge between said at least one floating gate and said source region, and between said at least one control gate and said drain region.

2. A semiconductor structure according to claim 1, wherein said first conductivity type is P– type and said second conductivity type is N+ type.

3. A semiconductor structure according to claim 1, wherein said layer of first dielectric material is silicon oxide and said layer of second dielectric material is oxide/nitride/oxide.

4. A semiconductor structure according to claim 1, wherein said layer of third dielectric material is a spacer oxide layer.

5. A semiconductor structure according to claim 1, wherein said at least one floating gate and said at least one control gate are both formed of polycrystalline silicon.

6. A semiconductor structure according to claim 1, wherein said metal silicide layer is formed by the reaction of silicon and a metal selected from the group consisting of Ti, Ta and Mo.

7. A semiconductor structure according to claim 1, wherein said at least one control gate is a split gate.

* * * * *